US006320265B1

(12) United States Patent
Chakrabarti et al.

(10) Patent No.: US 6,320,265 B1
(45) Date of Patent: Nov. 20, 2001

(54) SEMICONDUCTOR DEVICE WITH HIGH-TEMPERATURE OHMIC CONTACT AND METHOD OF FORMING THE SAME

(75) Inventors: Utpal K. Chakrabarti, Allentown, PA (US); Gustav E. Derkits, Jr., New Providence, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/290,535

(22) Filed: Apr. 12, 1999

(51) Int. Cl.[7] .......................... H01L 23/48; H01L 23/52; H01L 29/40

(52) U.S. Cl. .......................... 257/767; 758/750; 758/763; 758/768; 758/764; 758/753

(58) Field of Search .................................... 257/767, 758, 257/750, 763, 768, 764, 753; 438/118, 622, 652, 683, 685, 648, 656, 658

(56) References Cited

U.S. PATENT DOCUMENTS

| | | | | |
|---|---|---|---|---|
| 3,879,746 | * | 4/1975 | Fournier | 257/762 |
| 4,330,343 | | 5/1982 | Christou et al. | 257/764 |
| 4,637,129 | | 1/1987 | Derkits, Jr. et al. | 438/945 |
| 4,758,534 | | 7/1988 | Derkits, Jr. et al. | 257/183 |
| 4,960,718 | | 10/1990 | Aina | 438/571 |
| 5,182,218 | | 1/1993 | Fujihira | 438/185 |
| 5,200,349 | | 4/1993 | Yokoyama | 438/571 |
| 5,346,855 | | 9/1994 | Byrne et al. | 438/494 |
| 5,457,345 | * | 10/1995 | Cook et al. | 257/762 |
| 5,536,967 | | 7/1996 | Yokoyama | 257/485 |
| 5,559,817 | | 9/1996 | Derkits, Jr. et al. | 257/753 |
| 5,641,994 | * | 6/1997 | Bollinger et al. | 257/765 |
| 5,670,823 | * | 9/1997 | Kruger et al. | 257/753 |
| 5,675,159 | | 10/1997 | Oku et al. | 257/284 |
| 5,802,091 | | 9/1998 | Chakrabarti et al. | 372/49 |

OTHER PUBLICATIONS

"Effect of alloying behavior on the electrical characteristics of n–GaAs Schottky diodes metallized with W, Au, and Pt" by A. K. Sinha and J. M. Poate; Appl. Phys. Lett. vol. 23, No. 12, Dec. 15, 1973, pp. 666–668.

"Growth of RhGa on GaAs (001) in a molecular beam epitaxy system" by A. Guivarc'h, M. Secoue and B. Guenais; Appl. Phys. Lett. 52 (12), Mar. 21, 1988, pp. 948–950.

"n–GaAs Schottky Diodes Metallized With Ti and Pt/Ti" by A. K. Sinha, T. E. Smith, M. H. Read and J. M. Poate; SSE vol. 19, No. 6–E (1976), pp. 489–492.

"Reaction of Sputtered Pt Films On GaAs" by V. Kumar; J. Phys. Chem. Solids, 1975, vol. 36, pp. 535–541.

(List continued on next page.)

*Primary Examiner*—Jhihan B Clark
(74) *Attorney, Agent, or Firm*—Ian M. Hughes; Steve Mendelsohn

(57) ABSTRACT

A semiconductor device includes a semiconductor layer, prelayer, refractory layer, and conductive layer. The conductive layer includes an ohmic contact layer, and may also include a barrier layer, of a highly stable, low-resistance element or compound, such as Au or Ti, which is formed on the refractory layer. The refractory layer is a material that does not react with, or dissociate from, either the prelayer or the conductive layer when the semiconductor device is exposed to relatively high temperatures. The refractory layer material may be metal suicides, phosphides, or nitrides. The material of the prelayer is selected to minimize strain between the prelayer, the refractory layer and the semiconductor layer to provide a relatively strong bond between the refractory layer and semiconductor. The prelayer may be selected to provide relatively high current injection to the semiconductor, and may further form a low Schottky barrier height with the semiconductor. Effects from dissociation and/or diffusion of the materials forming the conductive layer to the semiconductor when the semiconductor device is exposed to temperatures above 350° C. may be reduced by employing the refractory layer and prelayer.

28 Claims, 1 Drawing Sheet

110
108
106
104
102
107
204
203
202
201

OTHER PUBLICATIONS

"Reliability and Degradation of Semiconductor Lasers and LEDs" by Mitsuo Fukuda; Chapter 6, Artech House (1991); pp. 185–205.

"Solid State Phase Equilibria in the Pt–Ga–As System" by X. Y. Zheng, K. J. Schulz, J. C. Lin and Y. A. Chang, Journal of the Less–Comon Metals, 146 (1989), pp. 233–239.

"The growth of $AuGa_2$ thin films on GaAs (001) to form chemically unreactive interfaces" by Jeffrey R. Lince, C. Thomas Tsai, and R. Stanley William; J. Mater. Res. 1 (4), Jul./Aug. 1986, pp. 537–542.

* cited by examiner

SEMICONDUCTOR DEVICE WITH HIGH-TEMPERATURE OHMIC CONTACT AND METHOD OF FORMING THE SAME

BACKGROUND OF THE INVENTION

1. Field of the Invention

The present invention relates to semiconductor devices, and, more particularly, to ohmic contacts for semiconductors capable of high-temperature processing.

2. Description of the Related Art

Semiconductor devices are increasingly designed to have one or more high-temperature process steps performed after formation of the ohmic contact during the fabrication sequence. Such high-temperature process steps may be required for 1) ion implantation (e.g., to form buried doped layers or to nullify doping of layers), 2) implant annealing, 3) surface treatment, 4) wafer thinning, 5) etching of in features, or 6) epitaxial growth, 7) dielectric deposition, or 8) dopant diffusion. These types of high-temperature steps may be classified as "post-epitaxial" processing steps, since the steps occur after the fabrication sequence but before the semiconductor device itself complete.

In addition, one or more high-temperature manufacturing steps may be employed when the semiconductor device is incorporated into a sub-assembly or component. For example, high temperature steps may be employed during the manufacture of an optical sub-assembly (OSA). The semiconductor laser, pin-diode and lens are affixed to a silicon mounting assembly with electrically conductive areas. The sub-assembly is formed, optically aligned and packaged in one or more steps. Each step typically employs Au—Ge or Au—Sn solder at between 320–380° C. For devices such as the OSA, increased performance of an integrated device may be achieved with solder having a higher melting temperature, as well as increasing the difference between the melting temperatures of the solder employed in each step. These types of high-temperature steps may be classified as "post-manufacturing" processing steps, since the manufacturing steps occur after the semiconductor devices employed are complete.

A high-temperature step that occurs after the formation of the ohmic contact layer may raise the temperature of the material of the ohmic contact and the material of the semiconductor regions near the ohmic contact. Exposure of the semiconductor device to high temperature may cause the properties of the materials of the various regions or layers in the semiconductor device structure to be modified.

In one case, the high temperature may cause dissociation of the materials. Dissociation is typically defined as the process of breaking a chemical compound into its elements (i.e., InP breaks into In and P when exposed to temperatures above 360° C. in vacuo). Dissociation typically occurs at the molecular level. However, dissociation may occur under normal temperatures employed during the fabrication sequence for forming alloys. Dissociation may be a precursor, and cause of, two processes that cause loss of adhesion between layers during the fabrication sequence: delamination and dewetting. Delamination is the physical lifting or pulling apart of layers that were once bonded. Dewetting refers to physical retraction of a wetted liquid from a substrate surface.

Silicide compounds of refractory metals have been employed in the art of semiconductor fabrication to form highly-stable Schottky barriers to, for example, GaAs or InP compound semiconductors. As is known in the art, refractory metals are materials having high chemical bonding strength, mechanical stability, and chemical inertness at temperatures on the order of 1400° C. and above. Such use of refractory metals is described in, for example, U.S. Pat. No. 5,200,349, and in U.S. Pat. No. 4,960,718, which are incorporated herein by reference. Refractory metals may be employed in the prior art to provide a Schottky barrier layer between the gate electrode and active layers of the compound semiconductor in a field effect transistor.

Further, refractory metals are strongly self-bonded chemical structures, enabling high-temperature heat treatment of the semiconductor material during masking and etching stages of transistor fabrication. Refractory metals have also been employed as masks during ion implantation of the device fabrication sequence. Such use of the refractory metals is described in, for example, U.S. Pat. No. 4,330,343, which is incorporated herein by reference.

However, refractory metals, while being strongly self-bonded chemically, tend to form poor or weak chemical bonds with other compounds. This poor chemical bonding is exhibited when the refractory metals are deposited over a substrate material of many common semiconductor compounds. If a refractory metal layer is formed next to the compound semiconductor of a device, high-temperature process steps may cause the compound semiconductor and the refractory metal layer to dissociate, resulting in device failure.

In another case, the high temperature may cause excess reaction or diffusion of the ohmic contact material with one or more materials of the adjacent regions of the compound semiconductor. Reaction or diffusion, for example, may be exhibited when the junction between the ohmic contact (e.g., Pt) and the compound semiconductor (e.g., GaAs substrate) is exposed to high temperatures. A constituent of the semiconductor compound, such as Ga (and to a lesser extent As), may "dissolve" from the substrate into the contact layer to form one or more alloys (e.g., forming $GaPt_3$, and to a lesser extent, $PtAs_2$). Au/GaAs and Pt/GaAs systems in particular exhibit considerable alloying under relatively high temperatures.

The alloys formed near the junction change the electrical properties of the junction, such as contact resistance and Schottky barrier height between the metal and the compound semiconductor. The actual compounds formed depend on the contact layer metal, semiconductor compounds, and layer thickness. In addition, layer composition is a sensitive function of exposure time and temperature. Consequently, identically fabricated devices of the prior art may exhibit gross variations in thermal stability and in operating characteristics of the device once the devices are exposed to a high temperature process step.

SUMMARY OF THE INVENTION

The present invention relates to a scheme for making semiconductor devices more resistant to semiconductor device variation when the semiconductor device is exposed to a high-temperature process step. A semiconductor device having high-temperature stability in accordance with the present invention comprises a semiconductor layer; a prelayer disposed on the semiconductor layer; a refractory layer disposed on the prelayer; and a conductive layer disposed on the refractory layer. The refractory layer inhibits migration of elements between the conductive layer and the semiconductor layer; and the prelayer inhibits loss of adhesion between the refractory layer and the semiconductor layer.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

In accordance with the present invention, when the semiconductor device is exposed to temperatures above ⅔ of the melting point of the semiconductor in absolute temperature (Kelvins), or the congruent evaporation temperature of a compound semiconductor, effects from diffusion and/or loss of adhesion (e.g., delamination and dewetting or other effects from dissociation) of the materials between a conductive layer and semiconductor layer may be reduced. The effects are reduced by employing a refractory layer and a prelayer disposed between the conductive layer and semiconductor layer.

Figure 1:
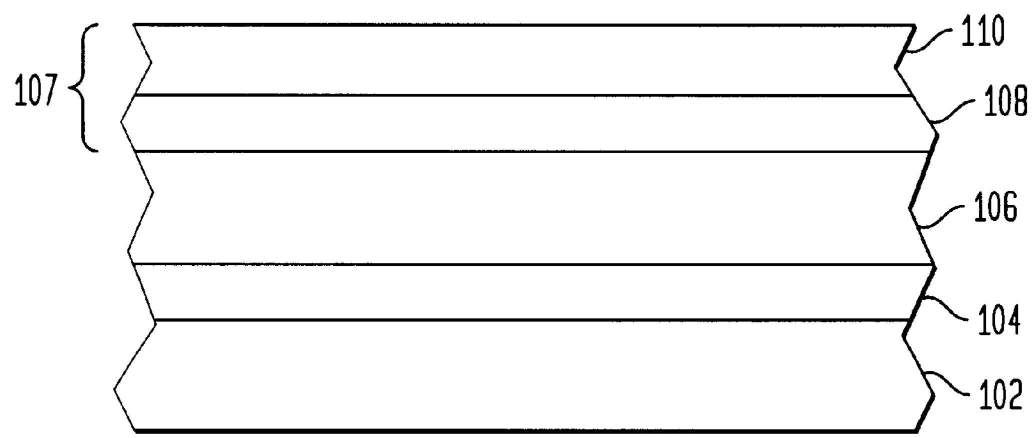
FIG. 1 shows a semiconductor device in accordance with the present invention.

FIG. 1 shows a semiconductor device 100 in accordance with the present invention, comprising semiconductor layer 102, prelayer 104, refractory layer 106, and conductive layer 107. Conductive layer 107 may comprise a bonding layer 110 and a barrier layer 108. Semiconductor layer 102 may typically be a semiconductor material such as GaAs or InP, and may be a substrate or a substrate with a lightly doped region of the semiconductor device (e.g., $n^-$, $n^+$, $p^-$, or $p^+$-type semiconductor material). As would be apparent to one skilled in the art, other semiconductor materials, such as non-metallic compounds or intermetallic compounds may be employed for the semiconductor 102. Commonly employed semiconductors may be selected from the Group IV elements (e.g. Si), Group III-V compounds (e.g., GaSb, InSb), mixed Group III-V compounds (e.g., $Ga_{1-x}In_xSb$, $InAs_x Sb_{1-x}$) or Group II-VI compounds.

As would be apparent to one skilled in the art, the processes leading to diffusion and/or loss of adhesion between layers vary depending on the particular materials selected for the semiconductor device. Consequently, while preferred embodiments are described below with respect to common InP and GaAs-based semiconductor devices having conductive layers of Au, Pd, Pt, or Ti, the present invention is not so limited. Materials for the various layers 104–107 may be selected based on common semiconductor design criteria depending on, for example, the semiconductor layer 102, lattice-matching between layers of the semiconductor device, the operating characteristics of the device, and desired postepitaxial and post-manufacturing processing steps.

For the following, the semiconductor device includes a metal-to-semiconductor (M-S) junction defined in addition to the junction between the conductive layer 107 and the refractory layer 106. The M-S junction may be defined between the refractory layer 106 and the prelayer 104, in which case the refractory layer 108 is preferably a metal compound and the prelayer 104 is preferably a semiconductor material. In the alternative, the M-S junction may be defined between the prelayer 104 compound and the semiconductor layer 102, in which case the prelayer 104 may desirably be a metal, multi-layer metal, or intermetallic compound.

Prelayer 104 is deposited over the surface of the semiconductor layer 102, and may be grown in a conventional manner, such as by molecular beam epitaxy (MBE). Alternative deposition techniques, such as chemical vapor deposition, physical evaporation, vapor phase epitaxy, and sputtering, may also be employed. The material for the prelayer 104 is preferably selected to reduce strain, or latticemismatch, between the prelayer 104 and semiconductor layer 102, and between the prelayer 104 and the refractory layer 106. Prelayer 104, therefore, provides relatively strong bonding with each of the refractory layer 106 and semiconductor layer 102. Prelayer 104 may be a metal, multi-layer metal, intermetallic compound or alloy, or other semiconductor material.

Commonly employed semiconductor materials for prelayer 104 may be selected from Group III-V compounds (e.g., GaSb, InSb), mixed Group III-V compounds (e.g., $Ga_{1-x}In_x$ Sb, $InAs_x$ $Sb_{1-x}$) or Group II-VI compounds. Doping materials for the prelayer 104 may generally be selected from the Group II or Group IV elements (e.g. Zn or C). Commonly employed metals for the prelayer 104 may be Ti, Pd, Pt, and Au, and combinations of these metals may be reacted to completion for a time and at a temperature sufficient to form one or more desired intermetallic compounds.

For a semiconductor device where the M-S junction is formed between the refractory layer 106 and prelayer 104, the prelayer 104 may also be selected to allow a low Schottky barrier height with the semiconductor layer 102, thereby providing for the relatively high current injection across the Schottky barrier. For this case, the region of the prelayer 104 adjacent to the refractory layer 106 is desirably selected from a group of low band-gap materials (e.g., less than 0.8 eV). In addition, if the region of the prelayer 104 adjacent to the refractory layer 106 is a low band-gap material, the remaining regions of the prelayer 106 may be formed as alternating layers of low and high band-gap material (e.g., greater than 0.8 eV).

For the semiconductor device where the M-S junction is formed between the refractory layer 106 and prelayer 104 and provides a low Schottky barrier height, the prelayer 104 may be a highly-doped semiconductor material. Such doping may be with holes (such as Zn or C), and for a preferred embodiment, such highly doped semiconductor material may have a carrier concentration on the order of $5\times10^{18}$ $cm^{-3}$, or greater. For example, the prelayer 104 may be InGaAs 1) lattice-matched to the semiconductor layer 102 of GaAs, and 2) doped with a carrier concentration of holes at least on the order of $5\times10^{18}$ $cm^{-3}$.

For a semiconductor device where the M-S junction is formed between the prelayer 104 and the semiconductor layer 102, a desired Schottky barrier height may exist between the conductive layer 107 and refractory layer 106 pair and the semiconductor layer 102. For this case, the prelayer 104 is desirably selected as a metal, multi-layer metal, or intermetallic compound. For example, layers of metals such as Ti and Au may be deposited, such as by evaporative deposition, and reacted to completion for a time and at a temperature sufficient to form an intermetallic compound with the desired properties. The prelayer 104 is preferably not doped when a metal, multi-layer metal, or intermetallic compound is employed, although doping may occur by leaching from the conductive layer 107 during manufacturing of the semiconductor device. Such doping by the leaching of metal from the conductive layer 107, in general, may not necessarily affect the semiconductor device, but effects of such doping may be considered during design of a semiconductor device in accordance with the present invention.

Alternatively, the semiconductor layer 102 itself may include a region (not shown in FIG. 1) of highly doped, low-bandgap material adjacent to the prelayer 104, such as InGaAs doped with a carrier concentration of holes on the order of $5\times10^{18}$ $cm^{-3}$. Such a region may be present due to manufacturing or other fabrication considerations to obtain a desired Schottky barrier height for the particular pairs of conductive layer material and semiconductor compound material. For this alternative case, the material of the prelayer 104 may also preferably be a metal, multi-layer metal, or intermetallic compound.

The prelayer 104 may typically be deposited with a thickness of between 50 and 5000 Angstroms. For some embodiments, a relatively thin prelayer 104 reduces interaction of the prelayer material with the materials of the semiconductor layer 102 and/or refractory layer 106. The relatively thin prelayer 104 reduces interaction since there is less prelayer material available to react with materials of other layers, reducing a depth of penetration into the semiconductor layer 102 and/or refractory layer 106.

The refractory layer 106 is deposited on the prelayer 104, and may preferably be deposited by sputtering or chemical vapor deposition, although other methods, such as evaporation may be employed. Refractory layer 106 is desirably selected as a strongly bonded material or alloy. The material of refractory layer 106 preferably exhibits little or no chemical potential across the junction between the conductive layer 107 and the refractory layer 106, or across the junction between the refractory layer 106, and the prelayer 104. Consequently, the material of the refractory layer 106 desirably does not react (e.g., either by diffusion or dissociation) with either the prelayer 104 or the conductive layer 107 when the semiconductor device is exposed to relatively high temperatures (e.g., exposed to 350–700° C. for up to an hour).

Preferred embodiments of the present invention may employ metal silicide compounds (e.g., W, Mo, or Ta silicide), phosphide compounds (e.g., W, Mo, Ta, Nb, Zr, or Ti phosphide), or nitride compounds (e.g., Nb, Ti, Zr, or Ta nitride) of refractory metals as a material for the refractory layer 106. Alternatively, non-stoichiometric mixed materials may be employed for the refractory layer 106. The non-stoichiometric mixed materials may be related to these refractory metals and are strongly-bonded materials or alloys, such as $TiSi_2$ with added N. Non-stoichiometric mixed materials may be preferred when the element added to the strongly bonded material or alloy provides matching of strain, or other control of stress, between refractory layer 106 and conductive layer 107, or between refractory layer 106 and prelayer 104.

The conductive layer 107 is a contact (e.g., ohmic contact metalization layer) of highly-stable, low-resistance element or compound, such as Au or Ti, formed on the refractory layer 106. The conductive layer 107 forms a bonding layer for the semiconductor device 100. The low-resistance may be as compared to bulk or spreading resistance of the remaining semiconductor device materials, and/or defined as a material having a conduction band outside of its band gap. Such a layer may preferably be deposited by MBE, although other methods may be employed. The conductive layer 107 provides a terminal for applying electrical voltage or current signals through the semiconductor device.

As shown in FIG. 1, the conductive layer 107 may comprise several metalization layers, and may be formed by first depositing at least one barrier layer 108, which may be an ohmic contact metalization layer, over the refractory layer 106, then depositing a bonding layer 110. The barrier layer 108 may desirably be a material that inhibits migration of the elements of the bonding layer 110 into the refractory layer 106, thereby inhibiting migration into the prelayer 104 and/or semiconductor layer 102. Barrier layer 108 may also be employed to inhibit migration of oxidizable elements from the refractory layer (e.g., Ti) or the semiconductor layer 102 (e.g., In, Ga) to the bonding layer of the bonding layer 110, which migration may cause bond failure. For example, barrier layer 108 may be formed from layers of Pt and Ti deposited on the refractory layer 106 of metal silicide ($WSi_2$, PtSi, or $TiSi_2$) to prevent migration of the element Au when Au is employed for the bonding layer 110.

While FIG. 1 shows the conductive layer 107 having bonding layer 110 and single barrier layer 108, the conductive layer 107 may be formed from multiple layers of conductive elements or compounds. For example, conductive layer 107 may be formed having a bonding layer 110 of Au deposited on a second barrier layer of Pt. The second barrier layer of Pt is deposited on a first barrier layer of Ti, which first barrier layer is deposited on the refractory layer 106.

Figure 2:
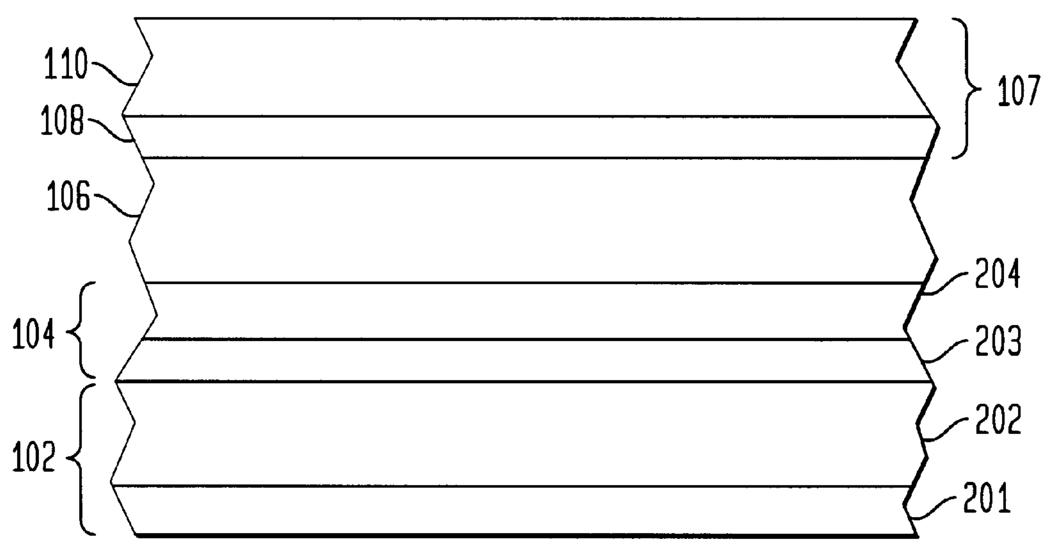
FIG. 2 shows an exemplary structure as may be employed in embodiments of a semiconductor device in accordance with the present invention.

An exemplary structure as may be employed in embodiments of a semiconductor device in accordance with the present invention is shown in FIG. 2. For the exemplary embodiments of the structure shown in FIG. 2, the operating characteristics of the semiconductor device remain stable for post-epitaxial and post-manufacturing processing at temperatures of 650° C. for about 1 hour. The semiconductor device includes semiconductor layer 102 having substrate 201 and low-bandgap region 202, prelayer 104 formed from metal layers 203 and 204, refractory layer 106, and conductive layer 107. Conductive layer 107 includes a bonding layer 110 and barrier layer 108.

For one exemplary embodiment employing the structure of FIG. 2, the semiconductor layer 102 includes a substrate of InP with a low band-gap region. The low band-gap region is of InGaAs doped with a carrier concentration of Zn on the order of $5\times10^{18}$ $cm^{-3}$. A prelayer 104 is formed by evaporative deposition of at least one pair of layers 203–204, which are of metal Ti of approximately 30 nm thickness for layer 203 and Pd of approximately 10 nm thickness for layer 204. After deposition, the metal layers 203 and 204 are reacted to completion for a time and at a temperature sufficient to form the intermetallic compound of (Ti/Pd). Such time may be between 1 min to 5 min, and such temperature may be between 100° C. to 400° C. A refractory layer 106 of $TiSi_2$ is then deposited by sputtering to a thickness of between 50 nm to 200 nm. The conductive layer 107 includes a barrier layer 108 of Pt deposited to a thickness of between 6 nm to 50 nm and a bonding layer 110 of Au deposited to a thickness of between 500 nm to 4000 nm. Barrier layer 108 and bonding layer 110 may be deposited by evaporation or sputtering.

For an alternative exemplary embodiment, the semiconductor layer 102 includes substrate 201 of InP and low band-gap region 202 of InGaAs doped with a carrier concentration of Zn on the order of $5\times10^{18}$ $cm^{-3}$. A prelayer 104 is formed by evaporative deposition of at least one pair of layers 203–204, which are of metal Ti of approximately 30–50 nm thickness for layer 203 and Pt of approximately 5–20 mm thickness for metal layer 204. After deposition, the layers 203 and 204 are reacted to completion for a time and at a temperature sufficient to form the intermetallic compound of (Ti/Pt). Such time may be between 1 min to 5 min, and such temperature may be between 100° C. to 400° C. The refractory layer 106 of $Ti_5P_3$ is then deposited by sputtering to a thickness of between 50 nm to 200 nm. The conductive layer 107 includes a barrier layer 108 of Pt deposited to a thickness of between 6 nm to 50 nm and a bonding layer 110 of Au deposited to a thickness of between 500 nm to 4000 nm. Barrier layer 108 and bonding layer 110 may be deposited by evaporation or sputtering.

For the exemplary embodiments of FIG. 2, the operation of the semiconductor device remained stable after post-epitaxial and post-manufacturing processing at temperatures of about 650° C. for about 1 hour. In comparison, a similar semiconductor device might remain stable for post-epitaxial and post-manufacturing processing at temperatures of no more than about 350° C. for about 1 hour. A similar semiconductor device may be formed with 1) a conductive layer disposed on the semiconductor layer, 2) a refractory layer disposed between a conductive layer and a semiconductor layer, or 3) a prelayer disposed between a conductive layer and a semiconductor layer.

It will be further understood that various changes in the details, materials, and arrangements of the parts or layers which have been described and illustrated in order to explain the nature of this invention may be made by those skilled in the art without departing from the principle and scope of the invention as expressed in the following claims.

What is claimed is:

1. A semiconductor device having high-temperature stability, comprising:

a semiconductor layer;

a prelayer disposed on the semiconductor layer;

a refractory layer disposed on the prelayer; and a conductive layer disposed on the refractory layer, wherein:

the refractory layer inhibits migration of elements between the conductive layer and the semiconductor layer; and the prelayer comprises a semiconductor material, inhibits its loss of adhesion between the refractory layer and the semiconductor layer, and forms a metal-to-semiconductor junction between the refractory layer and the prelayer.

2. The invention as recited in claim 1, wherein the prelayer includes a region of low band-gap material adjacent to the refractory layer.

3. The invention as recited in claim 1, wherein the of low band-gap material is a heavily-doped semiconductor material having carrier concentration of at least $5\times10^{18}$ $cm^{-3}$.

4. The invention as recited in claim 1, wherein the remaining regions of the prelayer are one or more pairs of high band-gap and low band gap materials.

5. The invention as recited in claim 1, wherein the refractory layer comprises a refractory metal of either a metal silicide, a metal phosphide, or a metal nitride.

6. The invention as recited in claim 1, wherein the refractory layer comprises a refractory metal combined with at least one added element to form a non-stoichiometric mixed material, the added element reducing strain between the refractory layer and the prelayer.

7. The invention as recited in claim 1, wherein the conductive layer includes a bonding layer and at least one barrier layer, the at least one barrier layer disposed between the refractory layer and the bonding layer.

8. The invention as recited in claim 1, wherein the semiconductor device has been subjected to a temperature of at least 350° C. for about an hour.

9. The invention as recited in claim 1, wherein:

the refractory layer is formed of a material and thickness sufficient to reduce formation, by dispersion, of alloys of an element of the semiconductor layer with an element of the conductive layer; and the prelayer is formed of a material and thickness sufficient to reduce loss of adhesion of the prelayer from the refractory layer and the semiconductor layer, wherein the formation of alloys by dispersion and loss of adhesion by dissociation are reduced in comparison to either 1) a similar semiconductor device formed with a conductive layer disposed on the semiconductor layer, 2) a similar semiconductor device formed with a refractory layer disposed between a conductive layer and a semiconductor layer, or 3) a similar semiconductor device formed with a prelayer disposed between a conductive layer and a semiconductor layer.

10. The invention as recited in claim 7, wherein the bonding layer is either Au, Pt or In.

11. The invention as recited in claim 10, wherein the bonding layer is Au, and each barrier layer is made of either Ti, Pd, or Pt.

12. The invention as recited in claim 8, wherein the semiconductor device has been subjected to the temperature during post-epitaxial processing.

13. The invention as recited in claim 8, wherein the semiconductor device has been subjected to post-manufacturing processing.

14. The invention as recited in claim 12, wherein the post-epitaxial processing is ion implantation, implant annealing, surface treatment, wafer thinning, feature etching, or epitaxial growth.

15. The invention as recited in claim 13, wherein the post-manufacturing processing is either soldering or thermocompression bonding of the semiconductor device to an integrated device.

16. The invention as recited in claim 9, wherein the refractory layer and the prelayer reduce dispersion and loss of adhesion, respectively, within the semiconductor device so as to permit stable operation of the semiconductor device after exposure to a temperature of at least 350° C. for about an hour.

17. A semiconductor device having high-temperature stability, comprising:

a semiconductor layer;

a prelayer disposed on the semiconductor layer;

a refractory layer disposed on the prelayer, wherein the refractory layer comprises a refractory metal of either a metal silicide, a metal phosphide, or a metal nitride; and a conductive layer disposed on the refractory layer, wherein:

the refractory layer inhibits migration of elements between the conductive layer and the semiconductor layer; and the prelayer inhibits loss of adhesion between the refractory layer and the semiconductor layer.

18. A semiconductor device having high-temperature stability, comprising:

a semiconductor layer;

a prelayer disposed on the semiconductor layer;

a refractory layer disposed on the prelayer, wherein the refractory layer comprises a refractory metal combined with at least one added element to form a non-stoichiometric mixed material, the added element reducing strain between the refractory layer and the prelayer; and a conductive layer disposed on the refractory layer, wherein:

the refractory layer inhibits migration of elements between the conductive layer and the semiconductor layer; and the prelayer inhibits loss of adhesion between the refractory layer and the semiconductor layer.

19. A semiconductor device having high-temperature stability, comprising:

a semiconductor layer;

a prelayer disposed on the semiconductor layer;

a refractory layer disposed on the prelayer; and a conductive layer disposed on the refractory layer and including a bonding layer and at least one barrier layer, the at least one barrier layer disposed between the refractory layer and the bonding layer, wherein:

the refractory layer inhibits migration of elements between the conductive layer and the semiconductor layer; and the prelayer inhibits loss of adhesion between the refractory layer and the semiconductor layer.

20. The invention as recited in claim 19, wherein the bonding layer is either Au, Pt or In.

21. The invention as recited in claim 20, wherein the bonding layer is Au, and each barrier layer is made of either Ti, Pd, or Pt.

22. A semiconductor device having high-temperature stability, comprising:

a semiconductor layer;

a prelayer disposed on the semiconductor layer;

a refractory layer disposed on the prelayer; and a conductive layer disposed on the refractory layer, wherein:

the refractory layer inhibits migration of elements between the conductive layer and the semiconductor layer; and the prelayer inhibits loss of adhesion between the refractory layer and the semiconductor layer, a metal-to-semiconductor junction is formed between the prelayer and the semiconductor layer, and the prelayer comprises at least one of a metal, a multi-layer metal, and an intermetallic compound.

23. The invention as recited in claim 22, wherein the semiconductor includes a region disposed adjacent to the prelayer, the material of the region being a relatively low band-gap material.

24. The invention as recited in claim 22, wherein the low band-gap material is a heavily-doped semiconductor material having carrier concentration of at least $5\times10^{18}$ $cm^{-3}$.

25. The invention as recited in claim 22, wherein the semiconductor device has been subjected to a temperature of at least 350° C. for about an hour during post-epitaxial processing.

26. The invention as recited in claim 22, wherein the semiconductor device has been subjected to post-manufacturing processing of either soldering or thermocompression bonding of the semiconductor device to an integrated device.

27. The invention as recited in claim 22, wherein:

the refractory layer is formed of a material and thickness sufficient to reduce formation, by dispersion, of alloys of an element of the semiconductor layer with an element of the conductive layer; and the prelayer is formed of a material and thickness sufficient to reduce loss of adhesion of the prelayer from the refractory layer and the semiconductor layer, wherein the formation of alloys by dispersion and loss of adhesion by dissociation are reduced in comparison to either 1) a similar semiconductor device formed with a conductive layer disposed on the semiconductor layer, 2) a similar semiconductor device formed with a refractory layer disposed between a conductive layer and a semiconductor layer, or 3) a similar semiconductor device formed with a prelayer disposed between a conductive layer and a semiconductor layer.

28. The invention as recited in claim 27, wherein the refractory layer and the prelayer reduce dispersion and loss of adhesion, respectively, within the semiconductor device so as to permit stable operation of the semiconductor device after exposure to a temperature of at least 350° C. for about an hour.

* * * * *

UNITED STATES PATENT AND TRADEMARK OFFICE

CERTIFICATE OF CORRECTION

PATENT NO. : 6,320,265 B1
DATED : November 20, 2001
INVENTOR(S) : Utpal K. Chakrabarti and Gustav E. Derkits, Jr.

It is certified that error appears in the above-identified patent and that said Letters Patent is hereby corrected as shown below:

Title page,
Item [57] ABSTRACT, replace "the refractory layer material may be metal suicides," with -- The refractory layer may be metal silicides, --

Column 7,
Line 47, replace "as recited in claim 1," with -- as recited in claim 2, --.
Line 50, replace "as recited in claim 1," with -- as recited in claim 2, --.

Signed and Sealed this

Fourteenth Day of May, 2002

*Attest:*

JAMES E. ROGAN

*Attesting Officer*

*Director of the United States Patent and Trademark Office*